United States Patent [19]

Nishimura et al.

[11] Patent Number: 5,608,362

[45] Date of Patent: Mar. 4, 1997

[54] PIEZOELECTRIC FILTER USING LITAO₃ SUBSTRATE

[75] Inventors: Toshio Nishimura; Jiro Inoue; Hiroaki Kaida, all of Nagaokakyo, Japan

[73] Assignee: Murata Manufacturing Co., Ltd., Japan

[21] Appl. No.: 227,631

[22] Filed: Apr. 14, 1994

[30] Foreign Application Priority Data

Apr. 15, 1993 [JP] Japan ................................... 5-113799
Apr. 15, 1993 [JP] Japan ................................... 5-113800

[51] Int. Cl.⁶ ............................. H03H 9/00; H03H 9/58
[52] U.S. Cl. ..................... 333/191; 333/189; 333/186; 310/361
[58] Field of Search ............................... 333/187–192; 310/326, 365, 366, 361

[56] References Cited

U.S. PATENT DOCUMENTS

| 3,644,761 | 2/1972 | Doi et al. ........................... 310/360 |
| 3,906,410 | 9/1975 | Williams ............................ 333/150 |
| 4,066,986 | 1/1978 | Takano et al. ....................... 333/72 |
| 4,159,435 | 6/1979 | Lewis ................................ 333/154 |
| 4,809,244 | 2/1989 | Penneck et al. ..................... 310/337 |
| 4,825,983 | 5/1989 | Nakanishi .......................... 310/49 R |

FOREIGN PATENT DOCUMENTS

| 0172511 | 7/1988 | Japan ................................... 333/192 |
| 0097314 | 4/1991 | Japan ................................... 333/191 |
| 0148907 | 6/1991 | Japan ................................... 333/191 |
| 4004603 | 1/1992 | Japan ................................... 333/191 |
| 6029775 | 2/1994 | Japan ................................... 333/191 |
| 6085603 | 3/1994 | Japan ................................... 333/191 |

OTHER PUBLICATIONS

*Patent Abstracts of Japan*, vol. 14, No. 154 (E-0907) 23 Mar. 1990 & JP-A-02 013 0078 Jan. 17, 1990.

S. A. Sakharov, et al. "Monolithic Filters Using Strong Piezoelectrics", *Forty-Fifth Annual Symposium of Frequency Control*, IEEE Catalog No. 91CH2965-2, May 29, 1991, pp. 181–183.

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A multi-mode piezoelectric filter includes a piezoelectric substrate made of a LiTaO₃ single crystal, a plurality of spaced electrodes which are formed adjacently on a front major surface of the substrate, and a counter electrode which is formed on a rear major surface of the substrate in opposition to the spaced electrodes. The spaced electrodes and the counter electrode coact with the intervening portion of the substrate to form two or more energy trapped type multi-mode filter elements vibrating in the thickness shear mode such that the filter elements are coupled to form a cascade connection. Damping material such as silicone gel is applied at least on the filter elements.

8 Claims, 6 Drawing Sheets

PIEZOELECTRIC FILTER USING LITAO₃ SUBSTRATE

BACKGROUND OF THE INVENTION

The present invention relates to a multi-mode piezoelectric filter.

In recent years, a filter used in a MHz frequency range having a wide bandwidth of the passband and high temperature stability of frequency has been required for use in communication devices or the like. A multi-mode filter is generally employed in the MHz frequency range since it is able to reduce spurious response and is easy to manufacture. In general, this filter is made of material such as piezoelectric ceramics or quartz crystal.

When a multi-mode filter is made of piezoelectric ceramics, however, it is difficult to obtain high temperature stability, since its frequency greatly varies in relation to temperature in a practical temperature range (−20° C. to 80° C.).

On the other hand, a multi-mode filter made of quartz crystal has excellent temperature stability. However, it is difficult for this filter to function properly in communication devices since its bandwidth is too narrow.

SUMMARY OF THE INVENTION

Accordingly, an object of the present invention is to provide a multi-mode piezoelectric filter having high temperature stability and having a wide bandwidth in the MHz frequency range.

Another object of the present invention is to provide a multi-mode piezoelectric filter which can reduce spurious response and improve group delay characteristics.

In order to attain the aforementioned objects, a piezoelectric filter according to the present invention comprises a thin piezoelectric substrate made of a LiTaO₃ single crystal. A pair of spaced electrodes are formed adjacently on a front major surface of the substrate, and a counter electrode is formed on a rear major surface of the substrate in opposition to the spaced electrodes. The spaced electrodes and the counter electrode coact with a portion of the substrate located therebetween to establish an energy trapped type multi-mode filter element vibrating in the thickness shear mode.

Two or more pairs of spaced electrodes may preferably be formed on the front major surface of the substrate, and a counter electrode may preferably be formed on the rear major surface of the substrate in opposition to the spaced electrodes. In this case, the spaced electrodes and the counter electrode coact with portions of the substrate located therebetween to form two or more energy trapped type multi-mode filter elements vibrating in the thickness shear mode such that the filter elements are coupled to form a cascade connection.

The LiTaO₃ single crystal, which is one of a plurality of piezoelectric single crystals, has a small temperature coefficient of frequency as compared with piezoelectric ceramics, and a large electromechanical coupling factor as compared with quartz crystal, i.e. coupling factor $k_{15}$=46, temperature coefficient $T_c$=2 ppm/° C. in LiTaO₃ single crystal. Therefore, a filter made of the LiTaO₃ single crystal is superior in temperature characteristics to that made of piezoelectric ceramics, and has a wider bandwidth than that made of quartz crystal.

In the LiTaO₃ single crystal, unwanted vibration is easily excited so as to increase a spurious response. Therefore, a thickness shear vibration mode having a smaller spurious response than other vibration modes is used in the present invention.

An X-cut of the LiTaO₃ single crystal is easy to cut because of a cleavage plane which is provided at −57° from the Y-axis. Further, the LiTaO₃ is preferably cut from an X-cut at an angle of −57°±0.5° from the Y-axis since its temperature characteristics, roll-off characteristics and group delay characteristics are all satisfactory.

The LiTaO₃ single crystal has a distorted top waveform since its Q-value is larger than that of piezoelectric ceramics (Q=5000 in LiTaO₃ single crystal, Q=1000 in PZT), and hence group delay deviation may disadvantageously be increased. Therefore, it is preferable to apply damping material at least on the filter element to effectively suppress the spurious response. Further, it is possible to reduce the Q-value, round the top waveform and reduce the group delay deviation by applying such damping material.

Since the LiTaO₃ single crystal has a small d-constant, a vibration excited therein is sensitively influenced by damping. When silicone rubber, well-known damping material, is employed, the response of principal vibration of the LiTaO₃ single crystal is so excessively suppressed that the loss is increased. Further, since the characteristic of silicone rubber such as hardness is considerably varied by temperature changes, the loss is largely varied due to temperature changes. Therefore, silicone gel is used as damping material in a preferred embodiment of the present invention. Since silicone gel is softer than silicone rubber and its temperature coefficient is smaller than that of silicone rubber, the loss is reduced due to a little damping effect and the temperature stability of the loss is improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
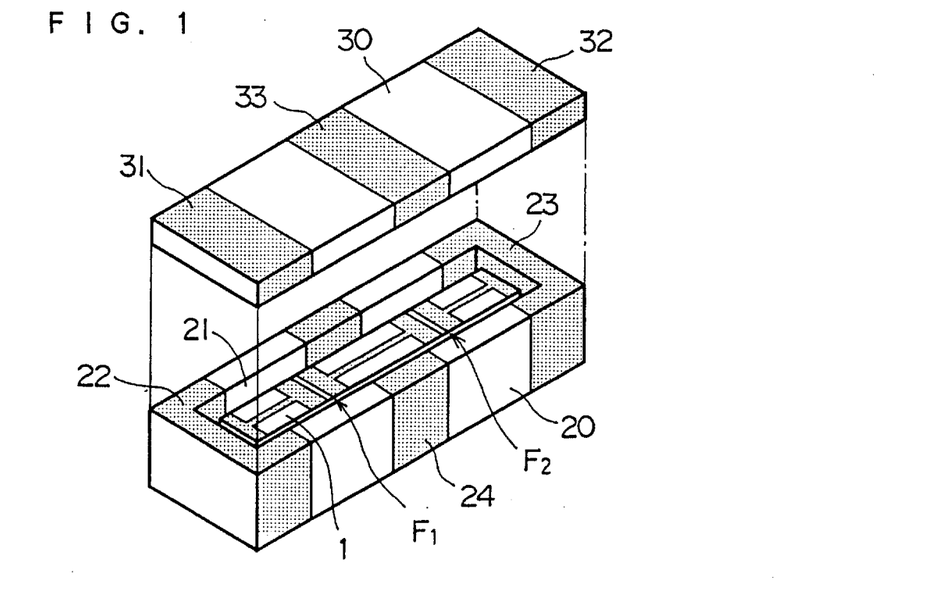
FIG. 1 is a perspective view showing a piezoelectric filter component according to an embodiment of the present invention.
Figure 2:
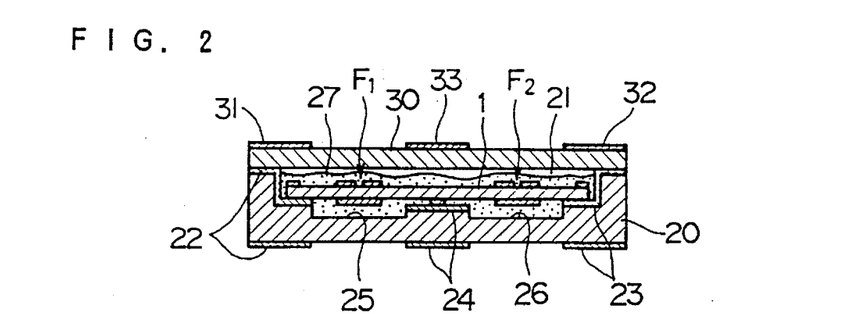
FIG. 2 is a sectional view of the piezoelectric filter component shown in FIG. 1.

FIGS. 1 and 2 show a piezoelectric filter formed as a chip component according to an embodiment of the present invention.

This filter comprises a filter unit 1, a case 20 storing the unit 1, and a cover 30 which is bonded to the case 20 to close its opening.

Figure 3:
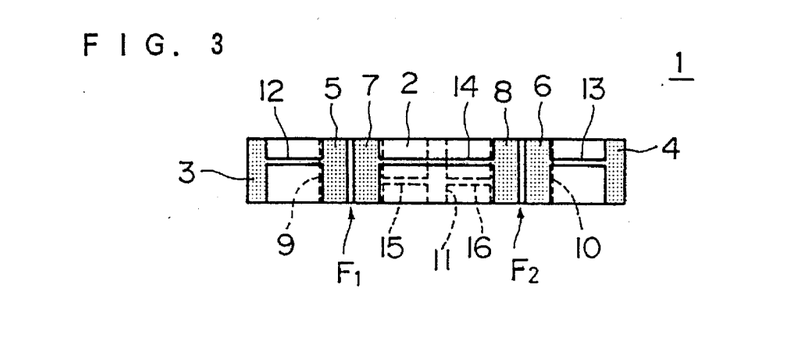
FIG. 3 is a front elevational view showing a filter unit.
Figure 4:
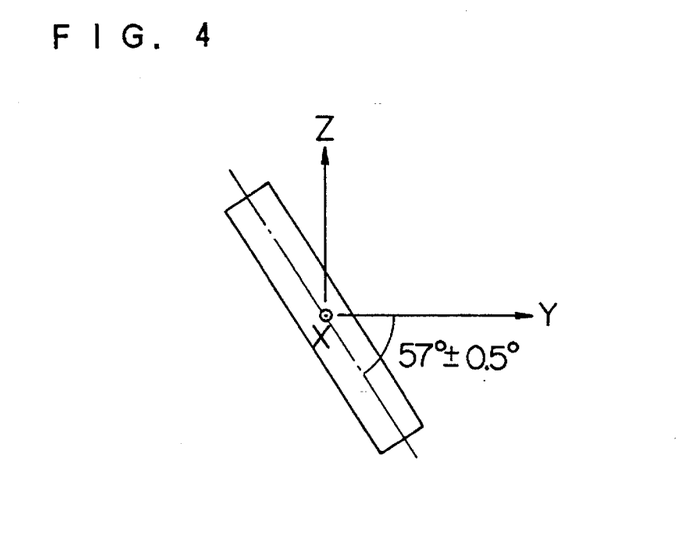
FIG. 4 illustrates a cut angle of a piezoelectric substrate.

As shown in FIG. 3, the unit 1 comprises an elongated rectangular thin piezoelectric substrate 2 having front and rear major surfaces. The substrate 2 is made of an X-cut of a LiTaO$_3$, single crystal which is cut at an angle of $-57\pm0.5°$ from the Y-axis, as shown in FIG. 4. Input and output terminal electrodes 3 and 4 are formed on both ends of the front major surface of the substrate 2, while a ground terminal electrode 11 is formed on a center of the rear major surface of the substrate 2. Two pairs of spaced electrodes 5, 7 and 6, 8 are formed on the front major surface of the substrate 2, and counter electrodes 9 and 10 are formed on the rear major surface of the substrate 2 in opposition to the spaced electrodes 5, 7 and 6, 8, respectively. The terminal electrodes 3 and 4 are connected with the electrodes 5 and 6 through extracting electrodes 12 and 13, respectively. The electrodes 5 and 6 are connected together by an extracting electrode 14. The counter electrodes 9 and 10 are connected through extracting electrodes 15 and 16 and the terminal electrode 11. The electrodes 3–11 are all extended in the widthwise direction parallel to the shorter edges of the substrate 2.

The electrodes 5, 7 and the counter electrode 9 coact with the intervening portion of the substrate 2 to form a first energy trapped type multi-mode filter element $F_1$, and the electrodes 6, 8 and the counter electrode 10 coact with the intervening portion of the substrate 2 to form a second energy trapped type multi-mode filter element $F_2$ such that the two elements $F_1$ and $F_2$ are coupled to form a cascade connection. These elements $F_1$ and $F_2$ vibrate in a thickness shear mode.

The case 20, which is made of insulating material such as alumina ceramics or resin, is provided on its upper surface with a cavity 21 for storing the unit 1. External electrodes 22 and 23 are formed on inner surfaces of both end portions of the cavity 21 to extend toward outer surfaces of both end portions of the case 20. External electrode 24 is formed on inner surfaces of a central portion of the cavity 21 to extend toward outer surfaces of a central portion of the case 20. Concave portions 25 and 26 which serve as vibration spaces are formed on a bottom of the cavity 21 between the external electrodes 22, 23 and 24. The unit 1 is stored in the cavity 21 of the case 20, and fixed thereto with conductive adhesive or solder (not shown). At the same time, the terminal electrodes 3, 4 and 11 of the unit 1 are connected with the external electrodes 22, 23 and 24 of the case 20, respectively.

The cover 30, which is made of insulating material similar to the case 20, is provided on its outer surface with three external electrodes 31, 32 and 33. These electrodes 31, 32 and 33 are connected with the external electrodes 22, 23 and 24, respectively.

Silicone gel 27 is applied in the cavity 21 so as to coat at least the elements $F_1$ and $F_2$, of the unit 1, as shown in FIG. 2. At the same time, the concave portions 25 and 26 are filled up with this silicone gel 27.

Figure 5:
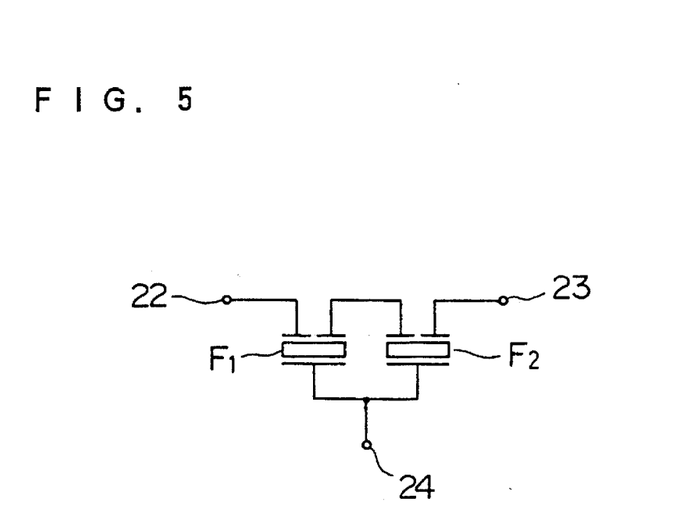
FIG. 5 is a circuit diagram of the piezoelectric filter.

FIG. 5 is a circuit diagram of the aforementioned component.

The following Table shows 3 dB bandwidth and frequency deviation level in a temperature range (−20° C. to 60° C.) of multi-mode filters which are made of piezoelectric ceramics (PZT), quartz crystal and an X-cut (Y−57°) of a LiTaO$_3$ single crystal, respectively.

| Type | 3 dB bandwidth | Frequency Deviation |
| --- | --- | --- |
| Piezoelectric Ceramics | 0.3% ~ 3% | about ± 0.2% |
| Quartz Crystal | 0.02%~0.2% | about ± 0.01% |
| X-Cut of LiTaO$_3$ | 2%~4% | about ± 0.05% |

As the above Table clearly shows, the X-cut of LiTaO$_3$ has the largest 3 dB bandwidth, and has the frequency deviation in the middle of those of the piezoelectric ceramics and quartz crystal.

Figure 6:
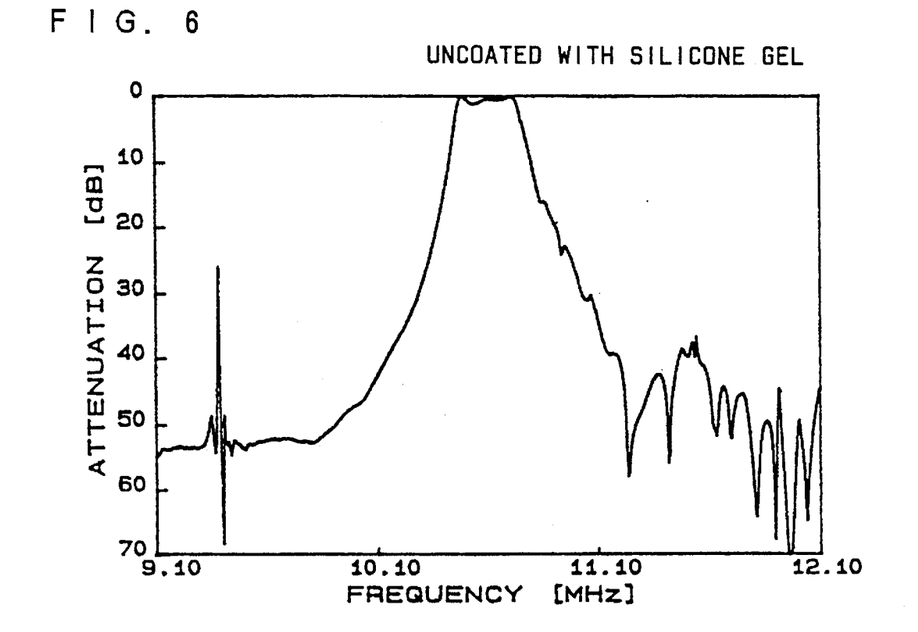
FIG. 6 illustrates filter characteristics of the filter unit uncoated with silicone gel.
Figure 7:
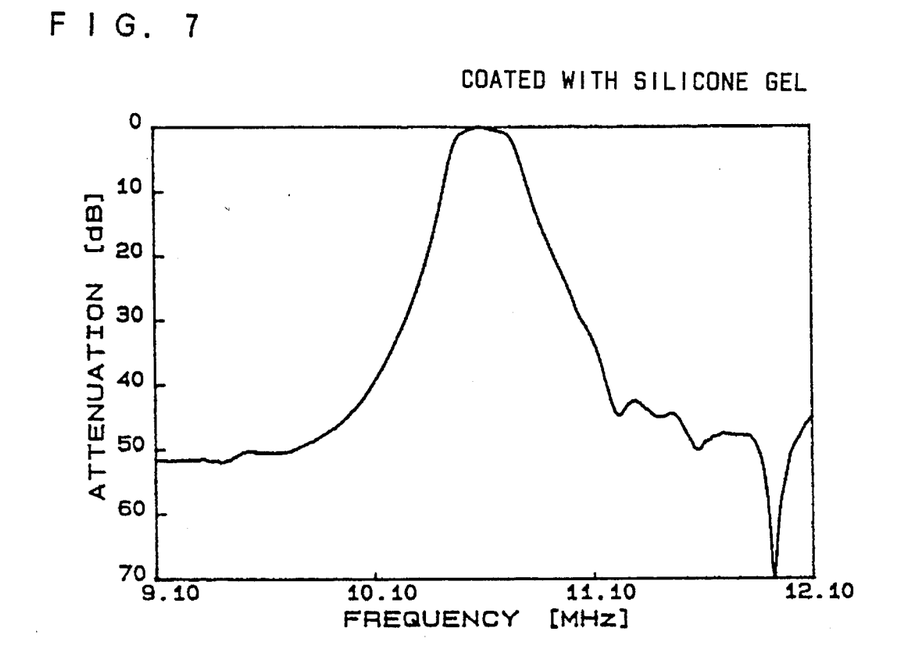
FIG. 7 illustrates filter characteristics of the filter unit coated with silicone gel.

FIG. 6 shows filter characteristics of the unit 1 uncoated with silicone gel 27, and FIG. 7 shows those of the unit 1 coated with the silicone gel 27. These figures clearly show that a spurious response is effectively suppressed by applying silicone gel 27 while a principal response is less suppressed, so that the filter characteristics are highly improved.

Figure 8:
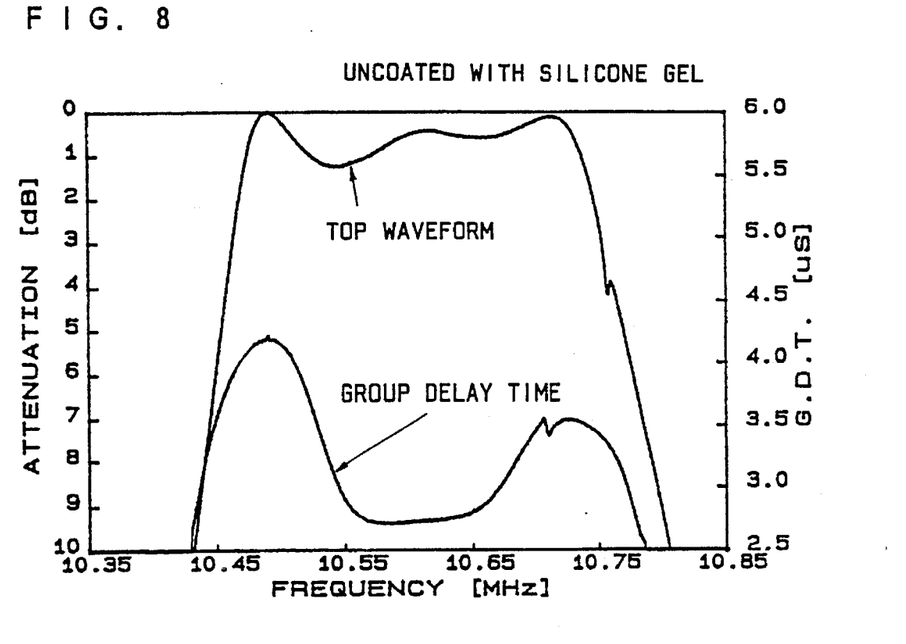
FIG. 8 illustrates a top waveform and group delay characteristics of the filter unit uncoated with silicone gel.
Figure 9:
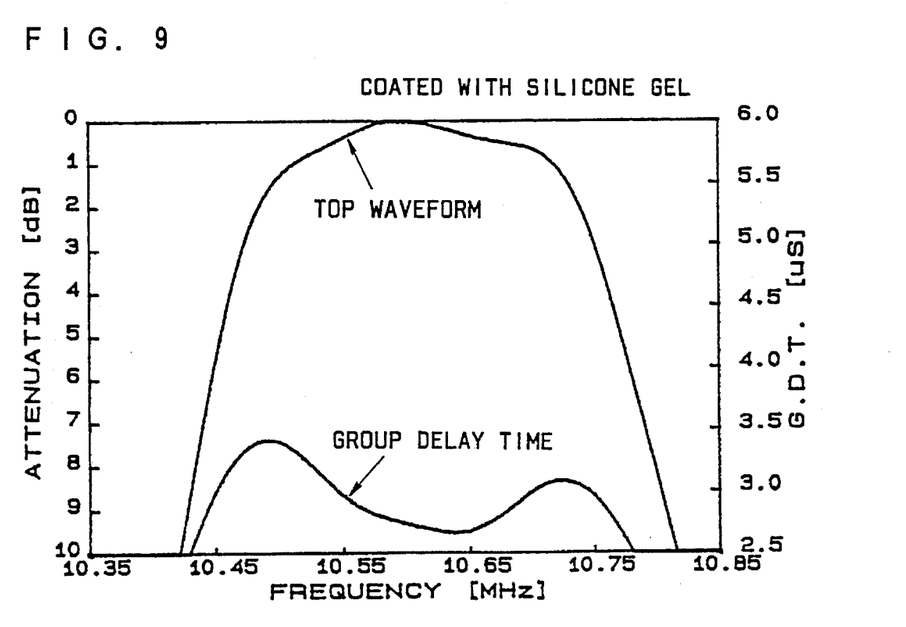
FIG. 9 illustrates a top waveform and group delay characteristics of the filter unit coated with silicone gel.

FIG. 8 shows a top waveform and group delay characteristics of the unit 1 uncoated with silicone gel 27, and FIG. 9 shows those of the unit 1 coated with silicone gel 27. These figures clearly show that the top waveform is rounded so as to improve the roll-off characteristics and the group delay deviation is reduced by applying silicone gel 27.

The comparison between characteristics of silicone rubber and those of silicone gel serving as damping material is now described.

Figure 10:
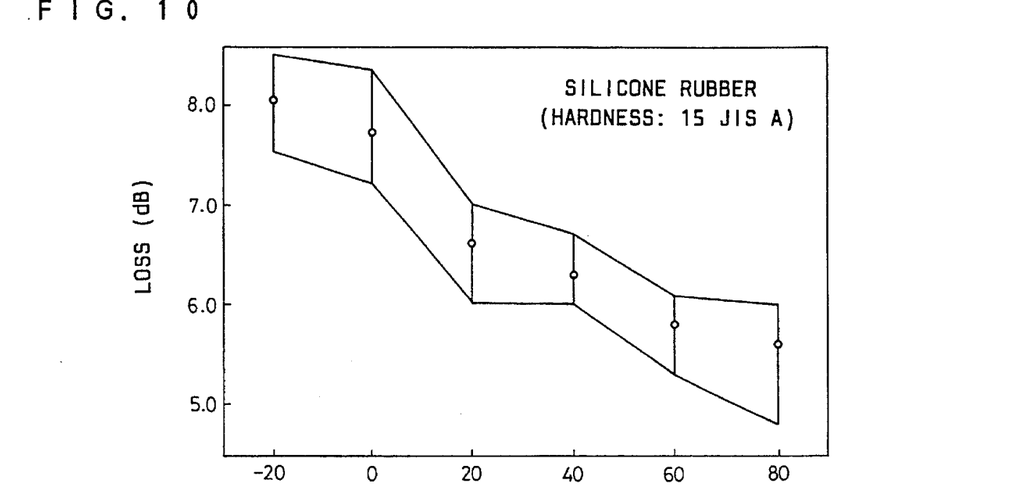
FIG. 10 is a characteristic diagram showing a relation between temperature and loss in a filter coated with silicone rubber.

FIG. 10 shows temperature dependence of loss of a filter unit employing silicone rubber having hardness of 15 JIS A (Japanese Industrial Standard A).

Figure 11:
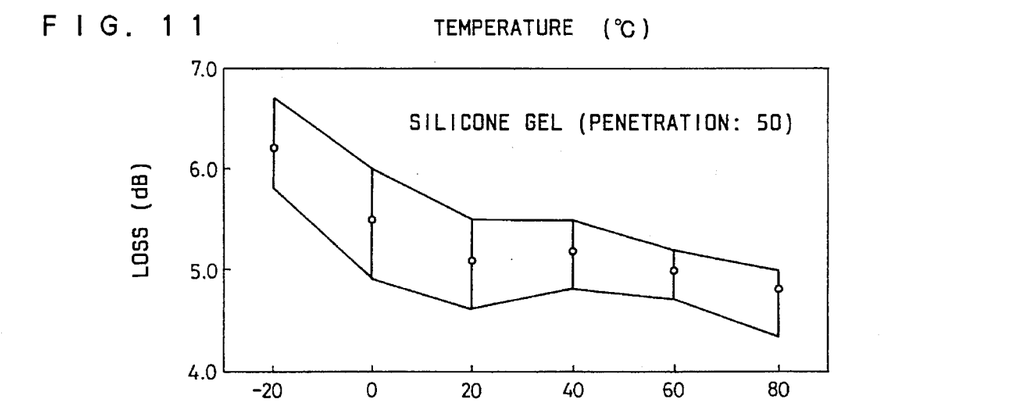
FIG. 11 is a characteristic diagram showing a relation between temperature and loss in a filter coated with silicone gel.
Figure 12:
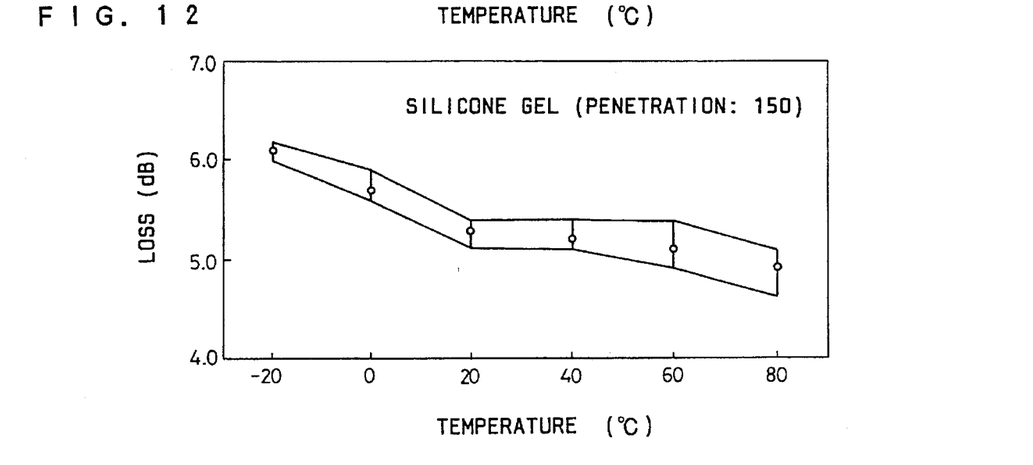
FIG. 12 is a characteristic diagram showing a relation between temperature and loss in a filter coated with another silicone gel.

FIGS. 11 and 12 show temperature dependence of loss of filter units employing silicone gels having penetration of 50 and 150.

These figures show that the filter units employing silicone gel have smaller loss and smaller temperature dependence of the loss than that of the filter unit employing the silicone rubber. Also, the temperature dependence of loss decreases as the penetration of the silicone gels increases. On the other hand, group delay characteristics are deteriorated as the penetration of silicone gel increases.

Figure 13:
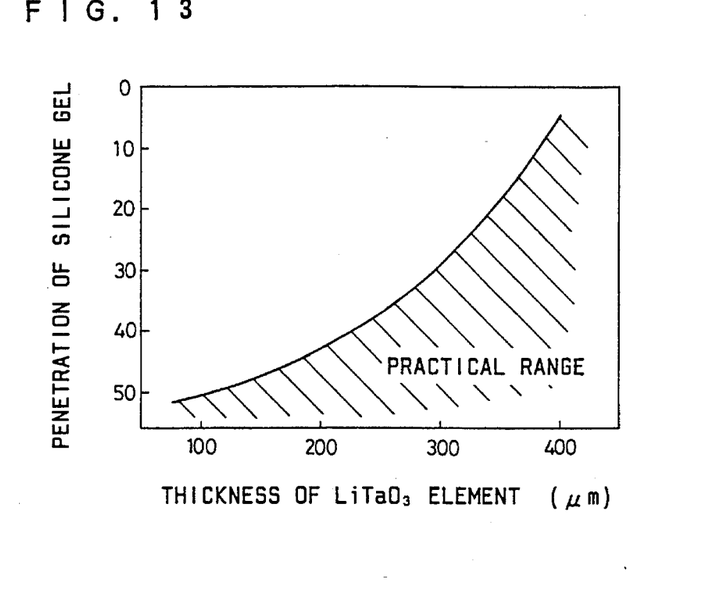
FIG. 13 illustrates relation between the thickness of a filter unit which is made of a LiTaO$_3$ single crystal and penetration of silicone gel.

FIG. 13 illustrates relation between the thickness of a filter unit which is made of an X-cut (Y−57°) of a LiTaO$_3$ single crystal and penetration of silicone gel. Referring to FIG. 11, a practical range is shown with slant lines.

As shown in FIG. 13, it is necessary to increase penetration of silicone gel as the thickness of the unit decreases.

Though the piezoelectric substrate is made of an X-cut of a LiTaO$_3$ which is cut at an angle of −57°±0.5° from the Y-axis in the aforementioned embodiment, the present invention is not restricted to this. It is possible to attain substantially similar characteristics by employing an X-cut which is cut at another angle such as −50° or −58° from the Y-axis.

Figure 14:
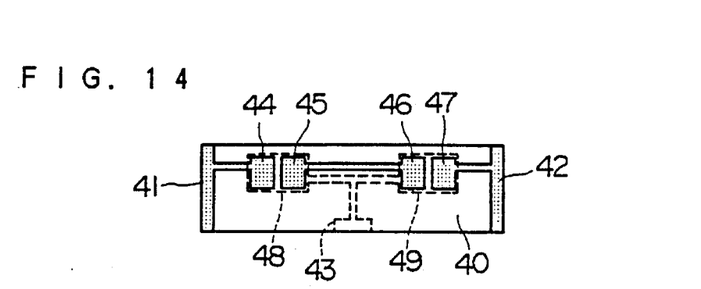
FIG. 14 is a front elevational view showing a filter unit according to a second embodiment of the present invention.
Figure 15:
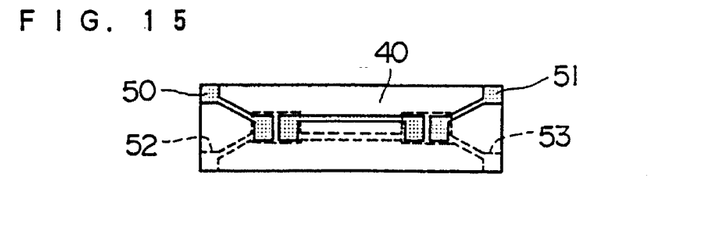
FIG. 15 is a front elevational view showing a filter unit according to a third embodiment of the present invention.
Figure 16:
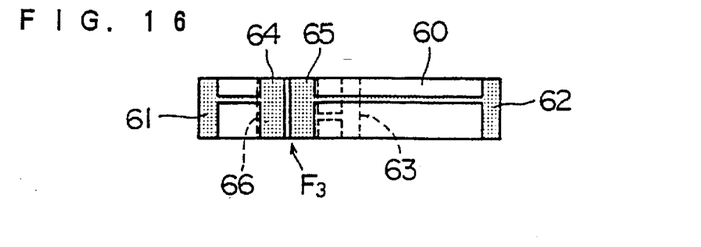
FIG. 16 is a front elevational view showing a filter unit according to a fourth embodiment of the present invention.

Further, electrode patterns of the multi-mode filter according to the present invention are not restricted to those shown in FIG. 3, but may be replaced by those shown in FIGS. 14, 15 or 16.

FIG. 14 illustrates two-element type filter unit according to a second embodiment of the present invention. In FIG. 14 numeral 40 denotes a substrate of an X-cut of a LiTaO$_3$ single crystal, numerals 41, 42 and 43 denote terminal electrodes, numerals 44, 45 and 46, 47 denote spaced electrodes, and numerals 48 and 49 denote counter electrodes corresponding to the electrodes 44, 45 and 46, 47. In this embodiment, unlike the first embodiment in FIG. 3, the spaced electrodes 44, 45 and 46, 47, the counter electrodes 48 and 49 and the ground terminal electrode 43 are not extended in the widthwise direction of the substrate 40.

FIG. 15 illustrates a different pattern of a two-element type filter unit from FIG. 14 in that input and output terminal electrodes 50 and 51 are formed on the two corners of the substrate 40 and two ground terminal electrodes 52 and 53 are formed on the remaining two corners of the substrate 40.

FIG. 16 illustrates one-element type filter unit according to a fourth embodiment of the present invention.

In FIG. 16, numeral 60 denotes a substrate of an X-cut of a LiTaO$_3$ single crystal, numerals 61, 62 and 63 denote terminal electrodes, numerals 64 and 65 denote spaced electrodes, and numeral 66 denotes counter electrode corresponding to the spaced electrodes 64 and 65. In this embodiment, one energy trapped type multi-mode filter element F$_3$ vibrating in the thickness shear mode is formed by the spaced electrodes 64 and 65 and the counter electrode 66 coacting with the intervening portion of the substrate 60.

In addition, the present invention is not restricted to the filter having one or two multi-mode filter elements formed on a single substrate, but is also applicable to a filter having three or more multi-mode filter elements.

As the above description clearly shows, since the piezoelectric filter according to the present invention comprises a substrate made of a LiTaO$_3$ single crystal and at least one energy trapped type multi-mode filter element vibrating in a thickness shear mode formed on the substrate, it is possible to obtain a filter having high temperature stability and having a bandwidth which is wider than those of filters made of piezoelectric ceramics and quartz crystal.

Further, it is possible to suppress a spurious response by applying damping material such as silicone gel onto the filter element, thereby improving the group delay characteristics and the roll-off characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piezoelectric filter comprising:

a piezoelectric substrate comprising an X-cut of a LiTaO$_3$ single crystal and having a front major surface and rear major surface;

a pair of spaced electrodes located adjacently on said front major surface of said substrate;

a counter electrode located on said rear major surface of said substrate in opposition to said spaced electrodes; wherein said spaced electrodes and said counter electrode cooperate with a portion of said substrate located therebetween to form an energy trapped type multi-mode filter element vibrating in the thickness shear mode, and said X-cut of said LiTaO$_3$ single crystal is cut at an angle of −57°±0.5° from the Y-axis.

2. A piezoelectric filter in accordance with claim 1, wherein damping material is applied at least on said filter element.

3. A piezoelectric filter in accordance with claim 2, wherein said damping material is silicone gel.

4. A piezoelectric filter in accordance with claim 1, further comprising an insulating case having a cavity and an opening at an upper portion of said cavity, said substrate being located in said cavity of said insulating case;

an insulating cover located on said insulating case for closing said opening of said insulating case;

three external electrodes located on inner surfaces of said cavity to extend toward outer surfaces of said insulating case; wherein said spaced electrodes are connected with two of said external electrodes, said counter electrode is connected with the other one of said external electrodes, and silicone gel is located in said cavity.

5. A piezoelectric filter comprising:

a piezoelectric substrate comprising an X-cut of a LiTaO$_3$ single crystal having a front major surface and rear major surface;

at least two pairs of spaced electrodes, each pair having two electrodes located adjacently on said front major surface of said substrate;

a counter electrode located on said rear major surface of said substrate in opposition to said spaced electrodes; wherein said spaced electrodes and said counter electrode cooperate with portions of said substrate located therebetween to form at least two energy trapped type multi-mode filter elements vibrating in the thickness shear mode such that said filter elements are coupled to form a cascade connection, and said X-cut of said LiTaO$_3$ single crystal is cut at an angle of −57°±0.5° from the Y-axis.

6. A piezoelectric filter in accordance with claim 5, wherein damping material is applied at least on said filter elements.

7. A piezoelectric filter in accordance with claim 6, wherein said damping material is silicone gel.

8. A piezoelectric filter in accordance with claim 5, further comprising an insulating case having a cavity and an opening at an upper portion of said cavity, said substrate being located in said cavity of said insulating case;

an insulating cover located on said insulating case for closing said opening of said insulating case;

three external electrodes located on inner surfaces of said cavity to extend toward outer surfaces of said insulating case; wherein outer two of said spaced electrodes are connected with two of said external electrodes said counter electrode is connected with the other one of said external electrodes, and silicone gel is located in said cavity.

* * * * *